(12) United States Patent
Blanchard (10) Patent No.: US 6,861,337 B2
(45) Date of Patent: Mar. 1, 2005

(54) METHOD FOR USING A SURFACE GEOMETRY FOR A MOS-GATED DEVICE IN THE MANUFACTURE OF DICE HAVING DIFFERENT SIZES

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 85 days.

(21) Appl. No.: 10/142,622

(22) Filed: May 10, 2002

(65) Prior Publication Data

US 2003/0209766 A1 Nov. 13, 2003

(51) Int. Cl.⁷ .......................................... H01L 21/301
(52) U.S. Cl. ..................... 438/462; 438/113; 257/341; 257/401; 257/620
(58) Field of Search ................................ 257/390, 331, 257/341, 401, 202, 203, 620; 438/128–129, 284, 286, 587, 113, 462

(56) References Cited

U.S. PATENT DOCUMENTS

| | | | | | |
|---|---|---|---|---|---|
| 3,753,289 | A | * | 8/1973 | Berner ........................ | 438/109 |
| 4,086,375 | A | * | 4/1978 | LaChapelle et al. ........ | 438/461 |
| 4,902,636 | A | * | 2/1990 | Akiyama et al. ........... | 438/273 |
| 4,942,447 | A | * | 7/1990 | Park et al. .................. | 257/369 |
| 5,217,916 | A | * | 6/1993 | Anderson et al. .......... | 438/128 |
| 5,656,843 | A | * | 8/1997 | Goodyear et al. .......... | 257/329 |
| 5,872,377 | A | * | 2/1999 | Jeon ........................... | 257/341 |
| 6,005,271 | A | * | 12/1999 | Hshieh ....................... | 257/341 |
| 6,259,497 | B1 | * | 7/2001 | McDonnell et al. ......... | 349/73 |
| 6,603,173 | B1 | * | 8/2003 | Okabe et al. ............... | 257/330 |
| 2002/0175353 | A1 | * | 11/2002 | Dray et al. ................. | 257/260 |
| 2003/0139020 | A1 | * | 7/2003 | Estacio ....................... | 438/462 |
| 2003/0183860 | A1 | * | 10/2003 | Uchiyama et al. .......... | 257/296 |

OTHER PUBLICATIONS

David Mavis et al., "A Reconfigurable, Nonvolatile, Radiation Hardened Field Programmable Gate Array (FPGA) for Space Applications," 10pp. www.APLDCon98/Papers/b8_mavis.pdf.

Charles W. Stirk et al., "Manufacturing Cost Analysis of Integrated Photonic Packages," Bosonics Inc., 1472 North St., Boulder, CO 80304, presented Jan. 22, 1999, 10pp. www.spie.org/web/meetings/programs/pw99/confs/3631B.html.

"The Do's and Don'ts of Using MOS–Gated Transistors" 7pp. www.eetkorea.com/ARTICLES/2000MAY/2000MAY04_BD_BT_AN.PDF.

* cited by examiner

Primary Examiner—Tom Thomas
Assistant Examiner—José R. Diaz
(74) Attorney, Agent, or Firm—Mayer Fortkort & Williams, PC; Karin L. Williams, Esq.; Stuart H. Mayer, Esq.

(57) ABSTRACT

A surface geometry for a MOS-gated device is provided that allows device size to be varied in both the x-axis and the y-axis by predetermined increments. The actual device size is set or "programmed" by the metal and pad masks or the contact metal and pad masks. This approach saves both time and expense, since only new contact, metal and pad masks, or new metal and pad mask are required for each new device. Wafers may also be manufactured and stored at an inventory location prior to contact or metal mask, significantly reducing the time required to manufacture new devices. It is also be possible to qualify a family of devices made using this approach without qualifying each device. In addition, the location of the source or the source and gate bonding pads may be easily moved for assembly in a new package or for a new application.

14 Claims, 11 Drawing Sheets

METHOD FOR USING A SURFACE GEOMETRY FOR A MOS-GATED DEVICE IN THE MANUFACTURE OF DICE HAVING DIFFERENT SIZES

STATEMENT OF RELATED APPLICATION

This application is related to U.S. patent application Ser. No. 10/142,600 entitled "A Surface Geometry For A MOS-Gated Device That Allows The Manufacture Of Dice Having Different Sizes", filed on even date herewith, the entire disclosure of which is hereby incorporated by reference.

FIELD OF THE INVENTION

The present invention relates generally to MOS-gated devices, and to methods for making the same.

BACKGROUND OF THE INVENTION

A large number of surface geometries have been developed for use in the manufacture of MOS-gated devices. These surface geometries or "layouts" include interdigitated structures as well as repeating or "cellular" structures, including the well-known hexagonal geometry exemplified by HEXFET® power MOSFETs. These various surface geometries have been developed to optimize device characteristics such as on-resistance and ruggedness. For a given geometry and voltage, the on-resistance of the device is inversely proportional to the active device area. To design a new device with a desired on-resistance using an existing surface geometry, only the product of the on-resistance of an existing device multiplied by its active area needs to be calculated. Based on this information, the active area of the new device is determined, the overhead for pads and termination is added, and the device with the desired on-resistance can be manufactured.

However, the conventional approach of producing a new set of masks for each different on-resistance value or each different size of the MOS-gated device is undesirable in that it can result in the generation of a large number of mask sets for devices that differ primarily in their on-resistance and in the size of their active areas. Moreover, each of these devices must be separately qualified before being shipped to customers. Conventional devices also do not provide an easy means by which gate and source pads can be moved to accommodate a particular end-use.

There is thus a need in the art for a method for producing MOS-gated devices that requires only a single set of masks to be produced, and that can use the same set of masks to make MOS-gated devices of varying sizes and having different on-resistances. There is also a need in the art for a method for making MOS-gated devices such that a family of such devices can be qualified, without having to qualify each particular device within the family. Finally, there is a need in the art for a surface design for MOS-gated devices that allows gate and source pads to be easily moved around within the device so as to accommodate particular end-uses, without requiring substantial re-engineering efforts. These and other needs are met by the methods and devices disclosed herein.

SUMMARY OF THE INVENTION

Modular surface geometries for a MOS-gated device, and methods for using these surface geometries to make MOS-gated devices, are disclosed herein. These modular surface geometries allow the device size to be varied along both the x-axis and the y-axis by predetermined increments.

In some embodiments of the devices and methodologies disclosed herein, the actual device size is set or "programmed" by the contact, metal and pad masks, while in other embodiments the device size is programmed by just the metal and pad masks. This approach saves both time and expense, since only new contact, metal and pad masks, or new metal and pad masks, are required for each new device. Moreover, the wafers which are to be employed in these devices may be prefabricated and stored at an inventory location prior to contact or metal mask, thus allowing a substantial portion of the manufacturing process to be conducted before the specifics of the device are known. This, in turn, significantly reduces the time required to manufacture new devices.

It is also possible to qualify a family of devices made using this approach without qualifying each specific device. In addition, the location of the source and gate bonding pads may be easily moved for assembly in a new package or for a new application. Hence, this approach provides a convenient alternative to producing a new complete set of masks for each new device required.

In one aspect, a method for making a MOS-gated device is disclosed herein. In accordance with the method, a plurality of discrete tiles is provided, each of which has at least one source region and at least one body region. Each tile will also typically have a number of gate contact regions disposed thereon. The plurality of tiles are assembled into an array so as to form a MOS-gated device. Preferably, the tiles are essentially identical in dimension. It is also preferred that the tiles are rectangular or square in shape. A gate metallization layer, which may be, for example, a series of discrete metal traces, is disposed over at least a portion of the array such that it is in electrical contact with the gate contact regions within the array. A source and body metallization layer is disposed over at least a portion of the array such that it is in electrical contact with the source and body regions of the tiles. A termination metallization layer may also be disposed over the tiles which form the outer perimeter of the device, and is typically disposed over these tiles such that it is typically in electrical contact with both the gate contact regions and the source and body contact regions of the outer perimeter tiles.

In another aspect, a MOS-gated device is disclosed herein which comprises an array of discrete tiles, wherein each tile in said array has source regions, body regions, and gate contact regions. A source and body metallization layer is provided which is in electrical contact with the source and body regions of at least two tiles in said array, and a gate metallization layer is provided which is in electrical contact with the gate contacts of at least two tiles in said array. Preferably, each tile in the array has four gate contact regions, at least two of which are in contact with the gate metallization layer for tiles disposed in the interior of the array. The tiles are typically disposed in the array such that a gap exists between adjacent tiles, and the source and body metallization layer preferably extends over this gap. The gate metallization layer and the source and body metallization layer will typically be electrically insulated from each other, as by maintaining a physical gap or space between them. The tiles in the array may have a trench or a planar structure.

In still another aspect, a MOS-gated device is provided herein which comprises an array of discrete tiles. The array includes a first plurality of tiles disposed along the exterior of the array, and a second plurality of tiles disposed within the interior of the array. Each of the first and second plurality of tiles has a source and body region and a gate contact region. The device further includes a source and body metallization layer which is in electrical contact with the source and body regions of the first and second plurality of tiles, and a termination metallization layer which is in electrical contact with at least one source and body region and at least one gate contact region on each of said first plurality of files.

These and other aspects of the methods and devices disclosed herein are described in further detail below.

DETAILED DESCRIPTION

Modular layout geometries for MOS-gated devices are disclosed herein that allow the size of the device to be varied along both the x-axis and the y-axis by predetermined increments, and methods are disclosed herein for using these layout geometries in the manufacture of MOS-gated devices having varying sizes and on-resistances from a single set of masks (that is, these methods require only that new contact, metal and pad masks, or new metal and pad masks, be fabricated for each new device). In accordance with the methodology disclosed herein, a plurality of essentially identical tiles may be deployed in parallel to obtain device-forming arrays having a desired size and on-resistance.

In the following discussion which references the figures, like reference numerals may be construed to refer to like elements.

Figure 1:
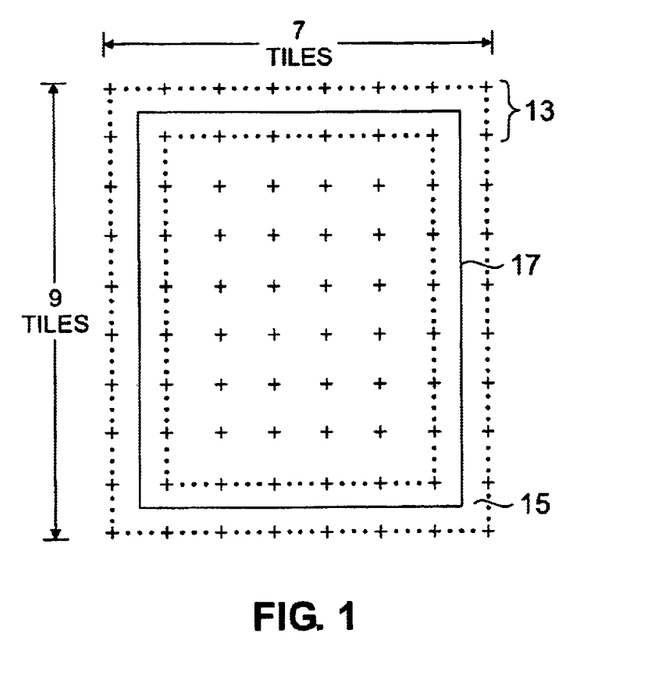
FIG. 1 is a schematic overview of a MOS-gated vertical DMOS device formed using a 7×9 array of identical tiles.

A general device layout designed in accordance with the principles disclosed herein is depicted in FIG. 1. A 7×9 array 11 of identical tiles 13 is shown. The actual device consists of a 6×8 array of tiles, since the outer perimeter tiles 15 are cut across scribe line 17 in the finished device (see element 74 of FIG. 10 for another illustration of a scribe line in a 7×9 array). Hence, each outer perimeter tile actually constitutes half a tile within the completed device. The size of the basic tile is chosen so that the outer perimeter of tiles forms the termination of the device and extends across the scribe line to also form the edge termination of the four die that are adjacent (not shown) in the horizontal and vertical direction, and four more die that are adjacent at the corners. Each tile is preferably square or rectangular, and any two of the tiles preferably have the same dimensions. It is also preferred that the length and width of each tile is the same (i.e., it is preferred that the tile is square).

Figure 2:
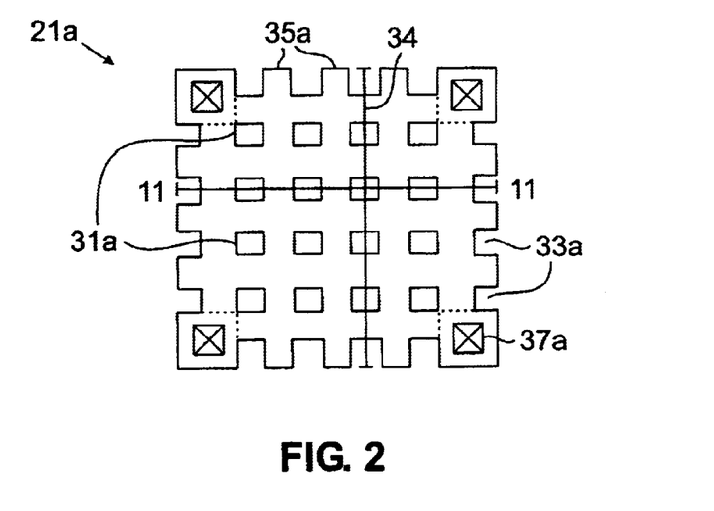
FIG. 2 is a schematic illustration of a tile with a source and body layout that is the same along the x-axis and the y-axis. This layout can be used for both planar and trench MOSFETs. The trench MOSFET has the gate polysilicon in the trenches, with only the polysilicon region in each corner above the wafer surface.
Figure 3:
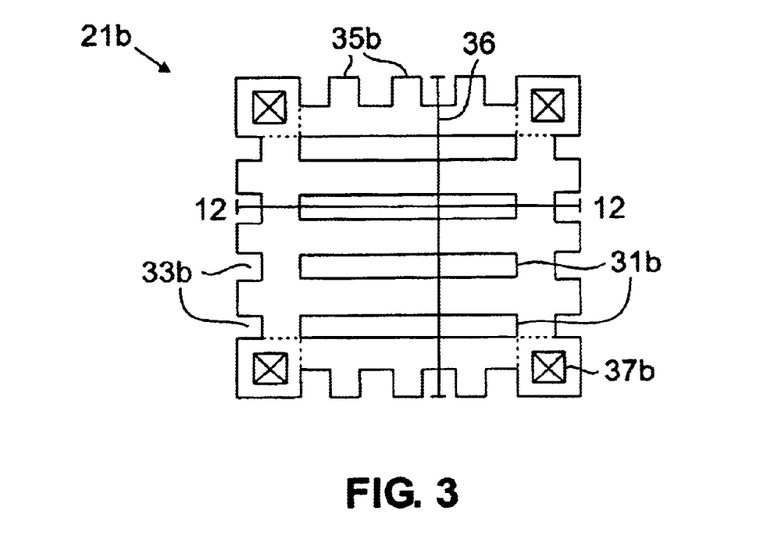
FIG. 3 is a schematic illustration of a tile with a source and body layout that is different along the x-axis and the y-axis. This layout can be used for both planar and trench MOSFETs. The trench MOSFET has the gate polysilicon in the trenches, with only the polysilicon region in each corner above the wafer surface.
Figure 11:
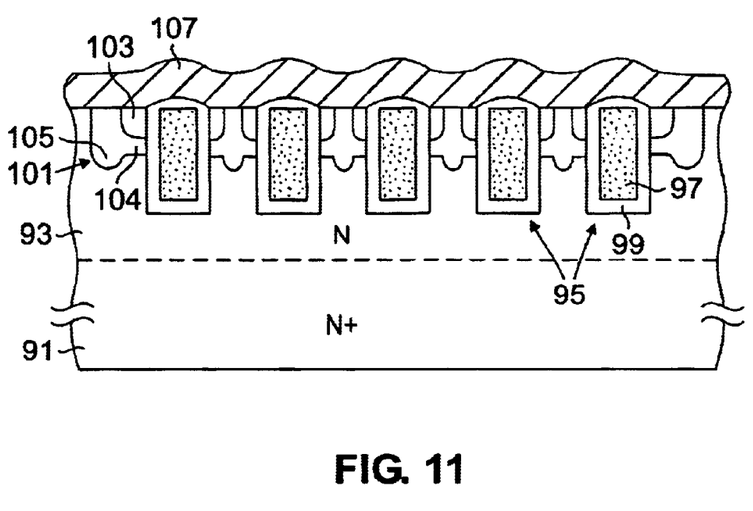
FIG. 11 is a cross-sectional view taken along LINE 11—11 of FIG. 2.

FIGS. 2–3 show two typical types of tiles that may be used in the practice of the methodology disclosed herein. In the tile 21a depicted in FIG. 2, the arrangement of the source and body regions 31a in the interior of the tile are the same when viewed in section along either LINE 11—11 or along axis 34 (i.e., the tile of FIG. 2 is symmetrical). This cross-section is depicted in FIG. 11 for a trench MOS-gated device.

Figure 12:
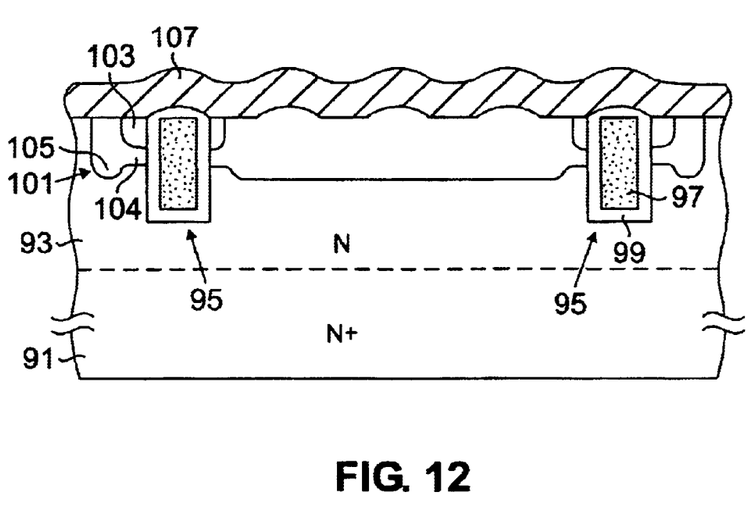
FIG. 12 is a cross-sectional view taken along the LINE 12—12 of FIG. 3.

By contrast, the arrangement of source and body regions 31b in tile 21b depicted in FIG. 3 is not symmetrical. In particular, in the tile depicted in FIG. 3, the arrangement of the source and body regions 31b in the interior of the tile when viewed in section along LINE 12—12 (this cross-section is depicted in FIG. 12 for a trench MOS-gated device) is distinct from the arrangement of the source and body regions in the interior of the tile when viewed in section along axis 36 of FIG. 3 (this later cross-section is identical to the cross-section of the tile 21a of FIG. 2 taken along LINE 11—11).

The geometry of the interior source and body regions of FIG. 2 are shown as being square, but they may be rectangular, polygonal (including, for example, hexagonal or octagonal), circular, or may have a shape defined by a combination of straight and/or curved lines. Similarly, the geometry of the interior source and body regions of FIG. 3, which is shown as being rectangular, may also be chosen from a large number of possibilities. Though the exterior source and body regions in both FIGS. 2 and 3 (elements 33a and 33b, respectively) are shown as being a square that is open on one side, their shape may also be chosen from among a large number of possibilities. In one possible alternative, the three exterior protruding gate regions of FIGS. 2 and 3 (elements 35a and 35b, respectively) are removed, leaving the gate with straight sides between the gate contact pads 37a, 37b.

Figure 4:
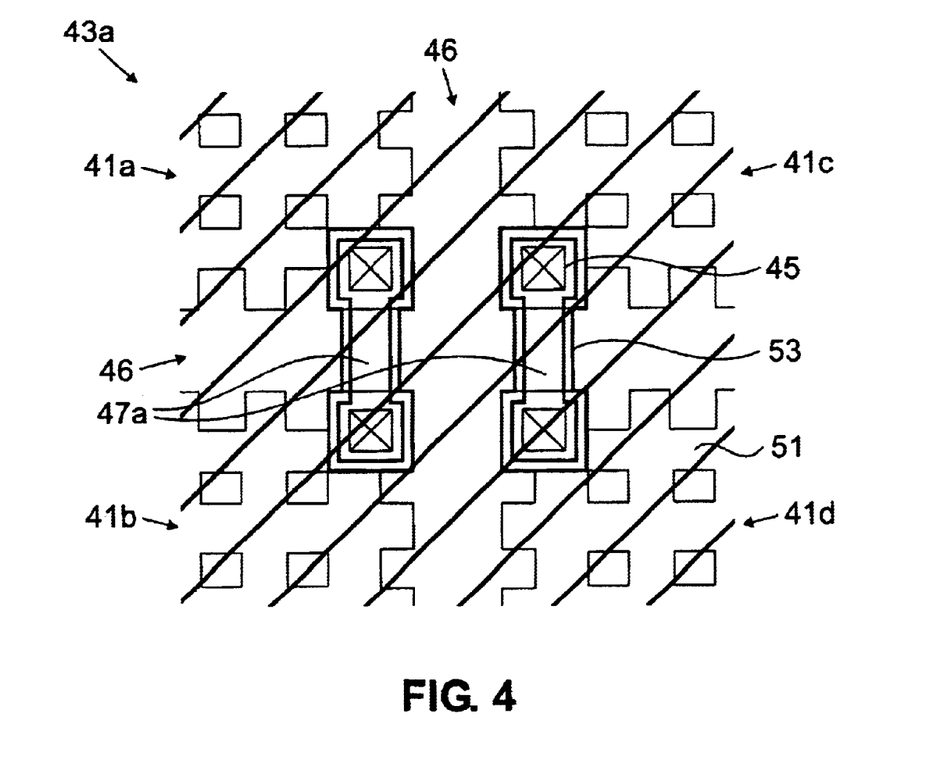
FIGS. 4–6 are schematic illustrations of the interior metallization layers in a tile array or chip.
Figure 5:
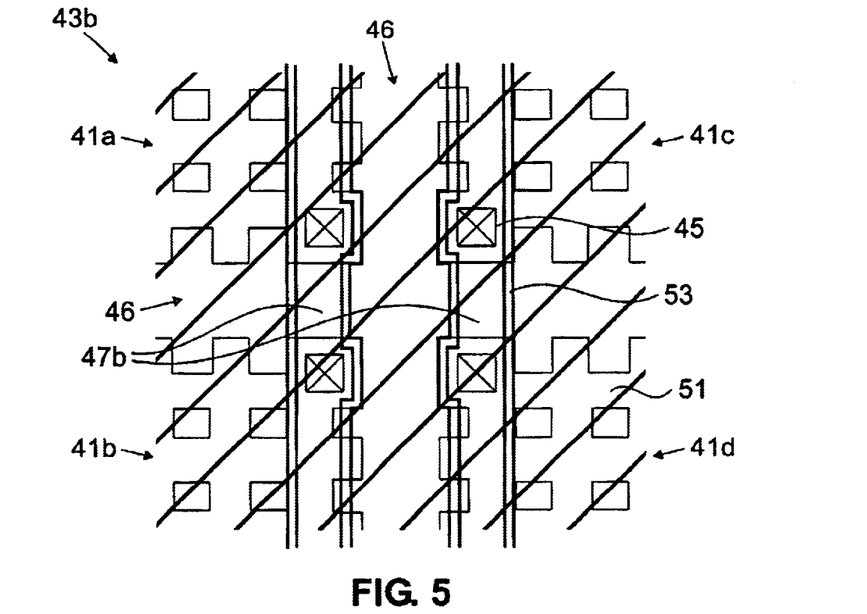
Figure 6:
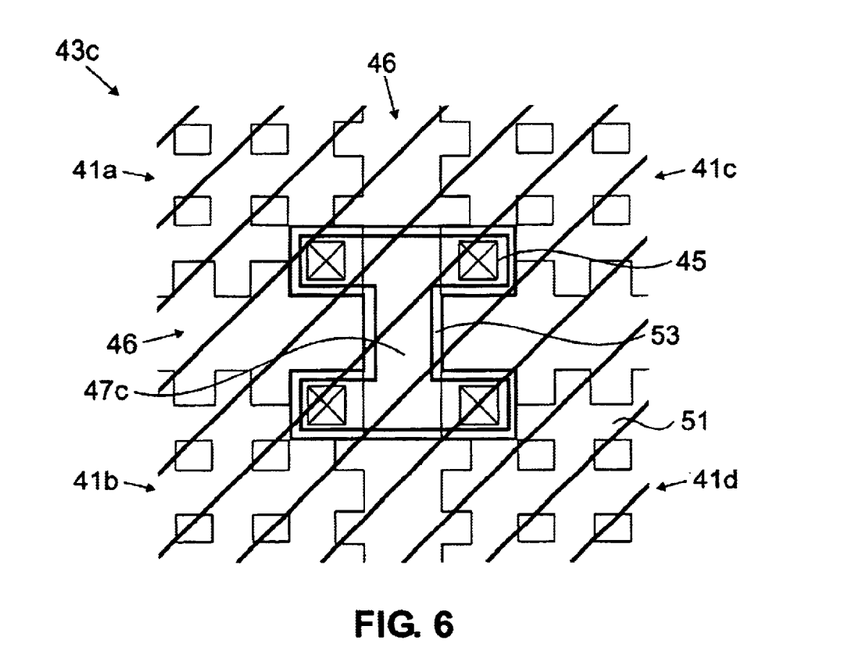

FIGS. 4–6 depict three specific metallization layer designs that may be used to connect the corners of four identical electrically active tiles 41a–d in the interior of tile arrays 43a, 43b and 43c in the devices described herein. Of course, one skilled in the art will appreciate that a large number of other interior metallization patterns are also possible. Each tile in the array is equipped with at least one exposed portion of polysilicon that serves as a gate contact pad 45 (the rest of the polysilicon is typically covered with a dielectric layer).

In the particular arrays shown, the tiles are spaced apart across a gap 46 or moat along each axis. At least some of the gate contact pads of tiles within the array are brought into electrical contact, either directly or indirectly, with one or more of the gate contact pads on other tiles in the array. Thus, in the array depicted in FIG. 4, gate contact pads on the first 41a and second 41b tiles in the array are brought into electrical contact with each other by a "dog-bone" shaped gate metallization layer 47a, and gate contact pads on the third 41c and fourth 41d tiles are electrically connected in a similar manner. In FIG. 5, gate contact pads on the first 41a and second 41b tiles in the array are brought into contact with each other by a longitudinally extending gate metallization layer 47b, and gate contact pads on the third 41c and fourth 41d files are electrically connected in a similar manner. In FIG. 6, gate contact pads on the first 41a, second 41b, third 41c and fourth 41d tiles in the array are brought into contact with each other by way of an H-shaped gate metallization layer 47c.

In each of the internal metallization embodiments depicted in FIGS. 4–6, the gate metallization layer 47a–c is electrically isolated from the source and body metallization layer 51. Preferably, this is accomplished by leaving a space or moat 53 between the two metallization layers so that the two metallization layers are essentially coplanar, since this arrangement is generally the most cost-effective from a manufacturing standpoint. However, embodiments are also possible in which the two metallization layers are disposed as separate layers in a stacked arrangement, with a dielectric material disposed between them to ensure that they remain electrically isolated from each other. In such an embodiment, for example, the gate contact pads may be contacted with a first thin metallization layer, while the source and body regions may be contacted with a second, somewhat thicker metallization layer.

Figure 7:
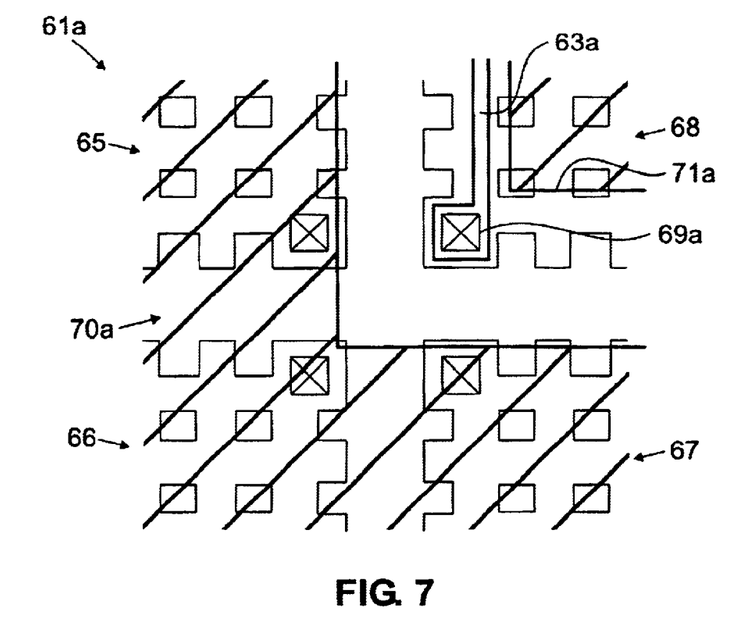
FIGS. 7–9 are schematic illustrations of the metallization layers at the exterior corner of a tile array or chip.
Figure 8:
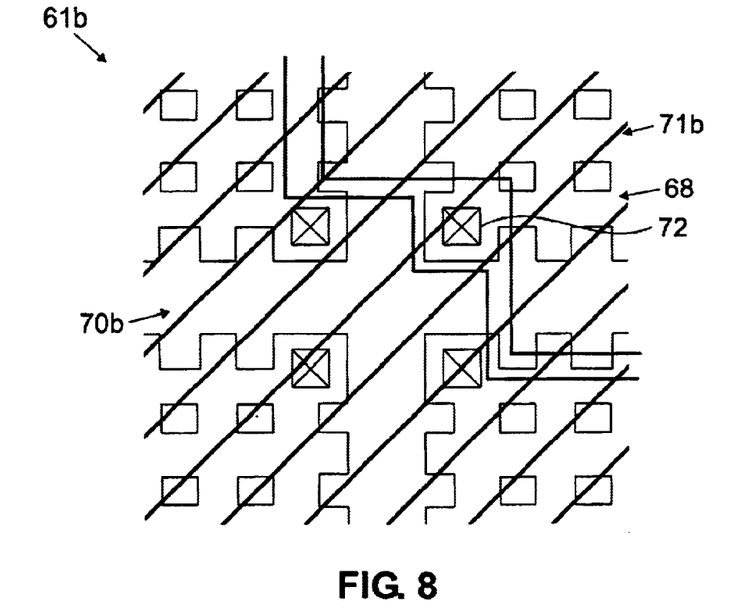
Figure 9:
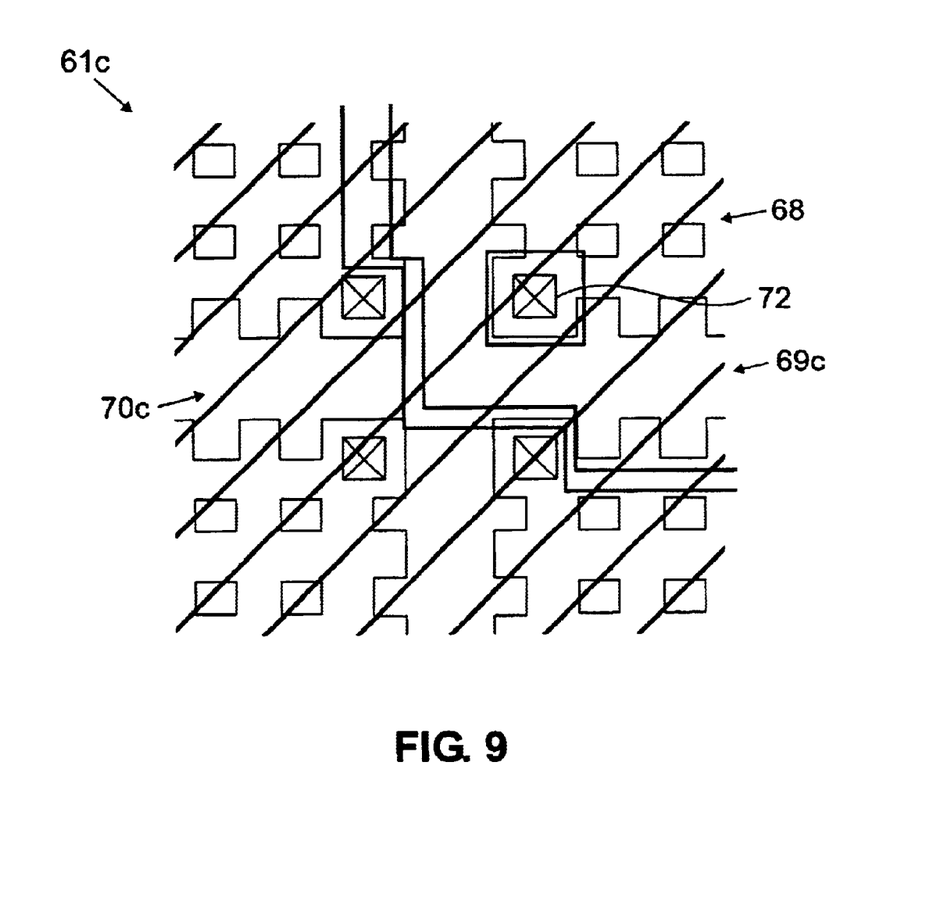

FIGS. 7–9 depict specific examples of possible metallization schemes across the four identical tiles at the exterior corner of a die. Of course, one skilled in the art will appreciate that a large number of other metallization schemes are also possible. In the array 61a depicted in FIG. 7, a termination metallization layer 70a extends across exterior tiles 65, 66, and 67, bringing the source and body regions and gate contact pads of those tiles into electrical contact. A source and body metallization layer 71a extends across a portion of interior tile 68. A gate metallization layer 63a extends across interior tile 68, including the gate contact pad 69a.

The array 61b of FIG. 8 is similar to that of FIG. 7, except that the termination metallization layer 70b and source and body metallization layer 71b are closer together, and the gate contact pad 72 of the interior tile 68 is electrically isolated. The array 61c of FIG. 9 differs from that of FIG. 8 primarily in the shape of the termination metallization layer 70c and the source and body metallization layer 69c. Once again, gate contact pad 72 of the interior tile 68 is electrically isolated.

Some of the key features and considerations behind the design of the tiles useful in making arrays of the type depicted in FIGS. 1–9 are as follows:

1. The size of the tile is preferably chosen such that the length and width of each tile edge is exactly the dimension needed for the width of the scribe line plus the width of the edge termination of the devices present on each side of the tile (alternatively, the length and width of the tile edge may be chosen to be the dimension of the scribe line plus the edge termination of the devices present on each side of the tile when multiplied by an integer).

2. To minimize any resistance contributed by the source and body metallization layer, this layer is preferably continuous to all source and body contacts and preferably has the maximum possible width.

3. The gate conductor for each tile preferably has enough contacts to provide an acceptably low resistance to the entire gate when metallized.

4. The gate conductor and the source and body regions of the tiles at the perimeter preferably provide an acceptable edge termination when connected together by metal.

5 The source pad or pads are preferably located over one or more tiles or tile portions by using the technique known as "bonding over the active area." Using this assembly technique, one or more wire bonds are attached to the source and body metal layer directly over source and body and gate regions. The use of bonding over the active area increases the chip area where there are source and body regions, increasing utilization, and in the context of this invention, eliminates the need for a dedicated "source bonding pad" cell.

6. A gate pad is preferably formed over any tile or set of tiles by not contacting the source and body regions of that tile or tiles.

Figure 10:
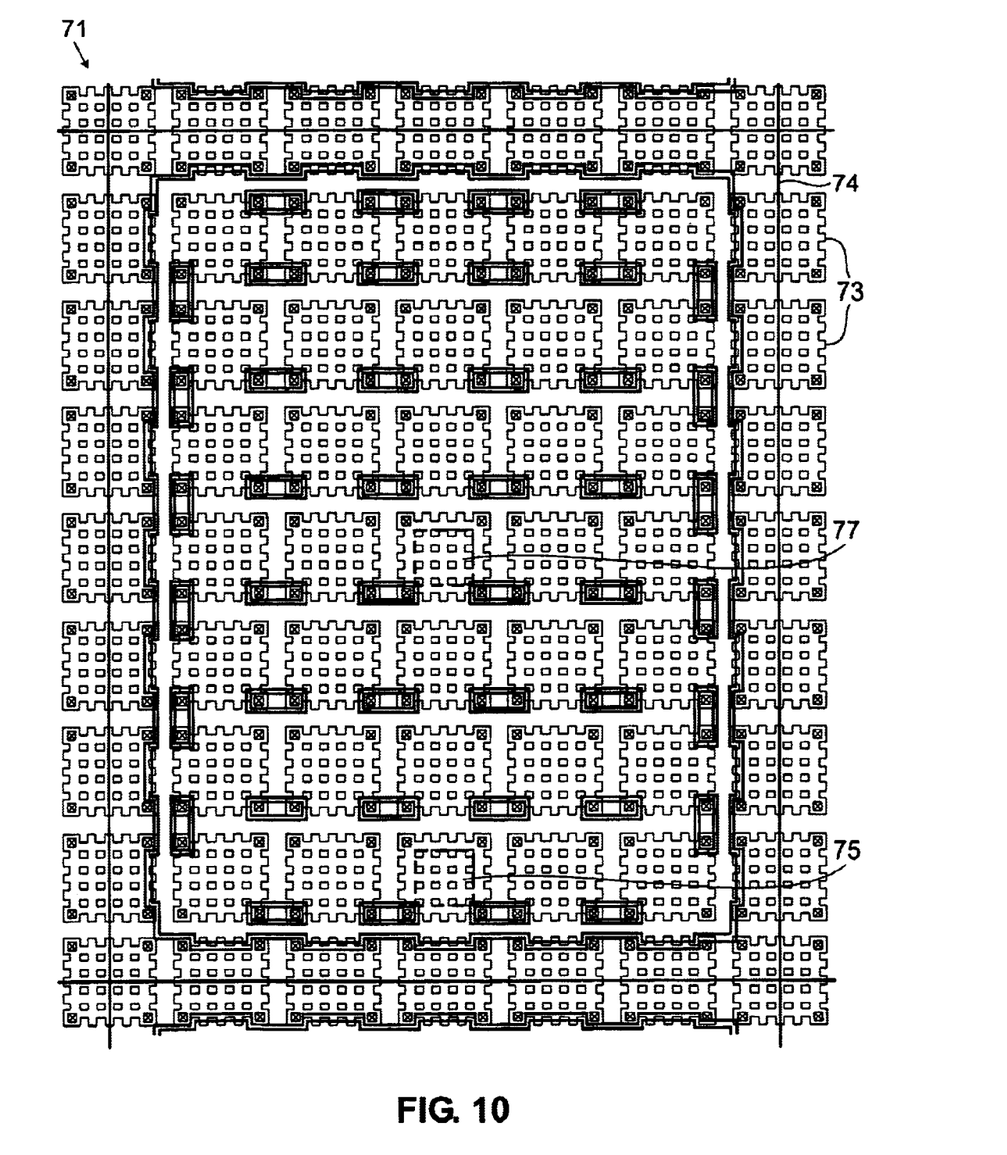
FIG. 10 is a detailed schematic diagram illustrating the layout of a MOS-gated vertical DMOS or trench DMOS device.

FIG. 10 illustrates a detailed layout of a vertical DMOS device of the type depicted in FIG. 1. The particular array 71 shown in FIG. 10 is a 7×9 array of tiles 73, though an array of any size may be used to make the vertical DMOS. It should be noted, of course, that the 7×9 array shown in FIG. 10 actually has an effective size of only 6×8 tiles, since ½ of each tile at each edge is in the adjacent device. In the particular array shown, the gate pad 75 is positioned at the bottom middle of the device, and the source pad 77 is positioned in the center of the device. The choice of an odd or an even number of tiles along each axis affects the location of the source and body pad (or pads), the location of the gate pad (or pads), and the symmetry of the device.

The tiles described herein allow the use of multiple source pads and/or gate pads, to which separate bonding wires may be attached. This feature allows for the fabrication of relatively large devices without a significant increase in the series resistance in the source and body metallization or in the gate conductor.

Thus far, tiles have been described that have the same length and width. However, it is also possible in the devices and methodologies described herein to use tiles of different lengths and widths. For reasons of optimum layout efficiency, however, it is preferred that, if the tile width and length are not equal, the longest dimension of the tile is an integer multiple of the shortest dimension.

The tiles shown in FIGS. 2 and 3 may be fabricated using trench technology as well as planar technology. If trench technology is used, only the regions of the polycrystalline silicon where the gate contacts 37a and 37b are formed are above the surface of the wafer.

FIGS. 11 and 12 illustrate the details of the tiles of the type depicted in FIGS. 2 and 3 which have a trench DMOS structure. The cross-sections of the cells of FIG. 2 taken along LINE 11—11 is depicted in FIG. 11. This cross-section is identical to the cross-section of FIG. 2 taken along axis 34 (i.e., the tile is symmetrical) and to the cross-section taken along axis 36 of FIG. 3. The cross-section of FIG. 3 taken along LINE 12—12 is depicted in FIG. 12 and is different from the cross-section taken along axis 36 (i.e., the tile is asymmetrical). The later cross-section is identical to the cross-section depicted in FIG. 11.

With reference to FIG. 11 and FIG. 12, the device depicted therein comprises an $N^+$ substrate 91 and an epitaxial layer 93. A series of trenches 95 are formed in the epitaxial layer. Each trench is filled with doped polysilicon 97 and contains a layer of gate oxide 99. Each trench is bounded by a double diffused source and body region 101 consisting of a source 103, a shallower diffused P-type region 104 and a deeper diffused $P^+$ region 105. A source and body metallization layer 107 is present on the top surface, contacting the source and body region 101.

As shown in TABLE 1, die sizes can be made with multiple rows and columns of the individual tiles, and with a single tile used as the gate pad. Some die sizes may be unattractive from a manufacturing point of view, due to the resulting aspect ratio. For this example, devices with an aspect ratio greater than 3:1 might not be easily manufactured. Die sizes other than those shown in TABLE 1, as well as die sizes larger than those shown in TABLE 1, can also be obtained. There is no particular upper limit to the size of the individual arrays (each of which has one tile as the gate pad), but there may be manufacturing concerns if the die size grows too large. The smallest practical size for the individual array having one gate pad is determined by the number of the active arrays for a single gate pad array. If the individual array size is below 2×3 tiles, there are no active tiles to conduct. At an individual array size of 2×3, the ratio of source and body tile area to gate pad tile area is 1:1, which may be too small to be practical in many applications.

TABLE 1

Arrangements of Tiles for Different Size Devices

| Number of Inner Tiles | Size of Inner Array | Number of Source and Body Tiles | Number of Gate Tiles | Total Number of Tiles in the Horizontal Direction | Total Number of Tiles in the Vertical Direction | Ratio of Inner Tiles to Total Tiles |
|---|---|---|---|---|---|---|
| 2 | 1 × 2 | 1 | 1 | 2 | 3 | 2:6 |
| 3 | 1 × 3 | 2 | 1 | 2 | 4 | 3:8 |
| 4 | 2 × 2 | 3 | 1 | 3 | 3 | 4:9 |
| 6 | 2 × 3 | 5 | 1 | 3 | 4 | 6:12 |
| 8 | 2 × 4 | 7 | 1 | 3 | 5 | 8:15 |
| 9 | 3 × 3 | 8 | 1 | 4 | 4 | 9:16 |
| 10 | 2 × 5 | 9 | 1 | 3 | 6 | 10:18 |
| 12 | 3 × 4 | 11 | 1 | 4 | 5 | 12:20 |
| 15 | 3 × 5 | 14 | 1 | 4 | 6 | 15:24 |
| 18 | 3 × 6 | 17 | 1 | 4 | 7 | 18:28 |
| 20 | 4 × 5 | 19 | 1 | 5 | 6 | 20:30 |
| 25 | 5 × 5 | 24 | 1 | 6 | 6 | 25:36 |
| 30 | 5 × 6 | 29 | 1 | 6 | 7 | 30:42 |
| 35 | 5 × 7 | 34 | 1 | 6 | 8 | 35:48 |
| 40 | 5 × 8 | 39 | 1 | 6 | 9 | 40:54 |
| 49 | 7 × 7 | 48 | 1 | 8 | 8 | 49:64 |
| 64 | 8 × 8 | 63 | 1 | 9 | 9 | 64:81 |
| 81 | 9 × 9 | 80 | 1 | 10 | 10 | 81:100 |
| 100 | 10 × 10 | 99 | 1 | 11 | 11 | 100:121 |

Devices fabricated using the tiles as previously disclosed require that a contact mask, a metal mask and a pad mask be generated for each new device. The need for a separate contact mask for each new device may be eliminated by including a dedicated gate pad tile at regular intervals in a sub-array. The location of the dedicated gate pad tile in the sub-array may be selected to provide one or more gate pads per die. In some embodiments, these dedicated gate pad tiles have the same polysilicon layer geometry as active tiles and have body dopant, but no source dopant, present, with the body regions not electrically contacted.

In other embodiments, the dedicated gate pad tiles have a continuous polysilicon layer geometry with only the outer perimeter matching the geometry of active tiles. Body dopant is present continuously below the polysilicon, and may be either electrically floating or electrically connected to the source and body terminal. Various other polysilicon geometries and dopant locations may be used to obtain electrical contact to the gate without affecting the electrical performance of the tiles or significantly increasing device on-resistance.

Gate pad tiles are placed with either an odd number or an even number of active tiles between them in both the horizontal and the vertical direction. If an odd number is chosen between gate pad tiles along each axis, greater symmetry is obtained. The exact number of active tiles between gate pad tiles in each direction determines the allowed die sizes for identical die. In the device 111 of FIG. 13, for example, there are 5 active tiles 115a between gate pad tiles 113a in the horizontal direction and 7 active tiles in the vertical direction. In the entire sub-array 117a, counting all rows and columns, there are 6 columns and 8 rows.

Figure 13:
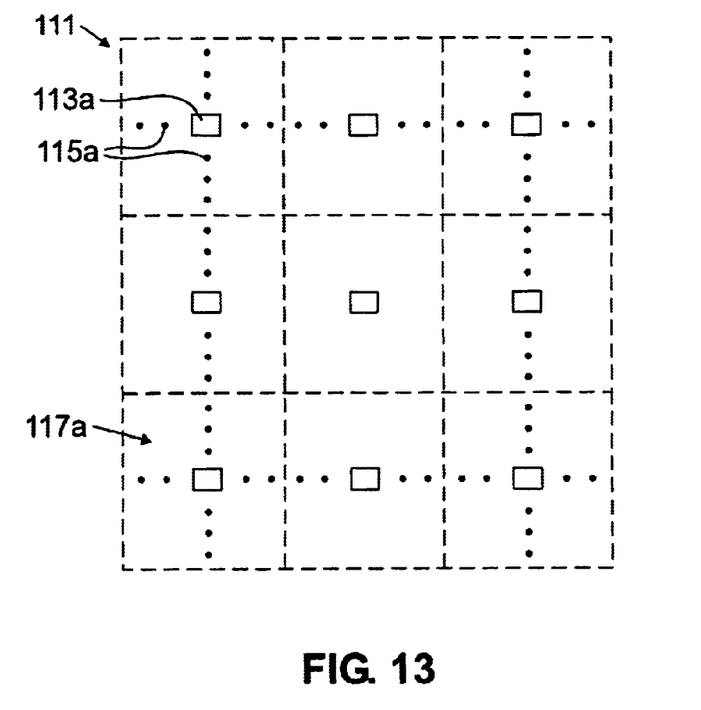
FIG. 13 is a schematic diagram of a 3×3 arrangement of 6 tile by 8 tile sub-arrays, each of which is equipped with one pad tile.
Figure 14:
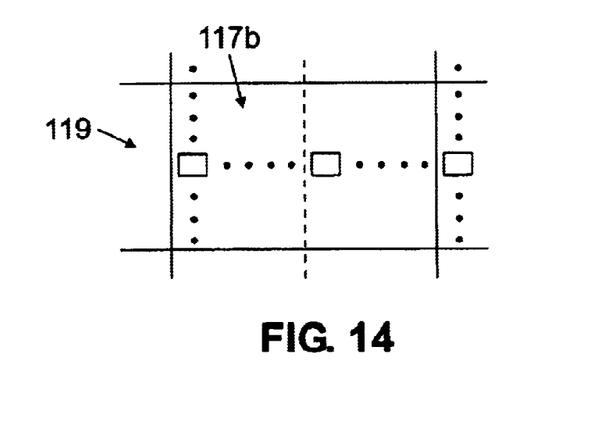
FIG. 14 is a schematic diagram of a 1×2 array of tiles equipped with a gate pad tile near the scribe line.
Figure 15:
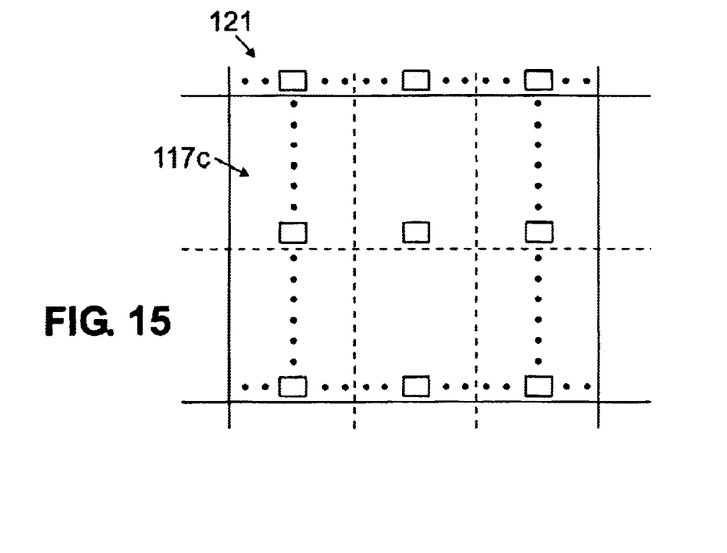
FIG. 15 is a schematic diagram of a 3×2 array of tiles with a gate pad tile used for the gate contact.
Figure 16:
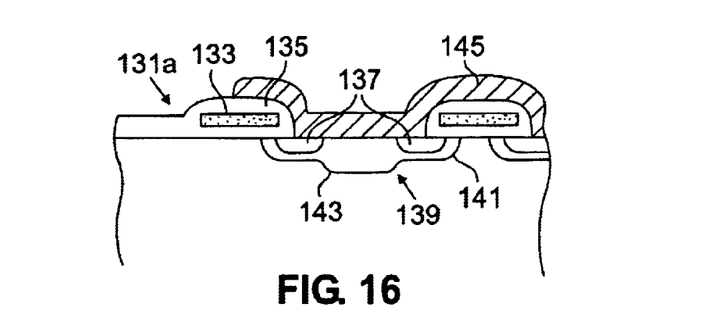
FIG. 16 is a schematic diagram illustrating a gate field with the oxide below the gate having a uniform thickness and no perimeter doping.
Figure 17:
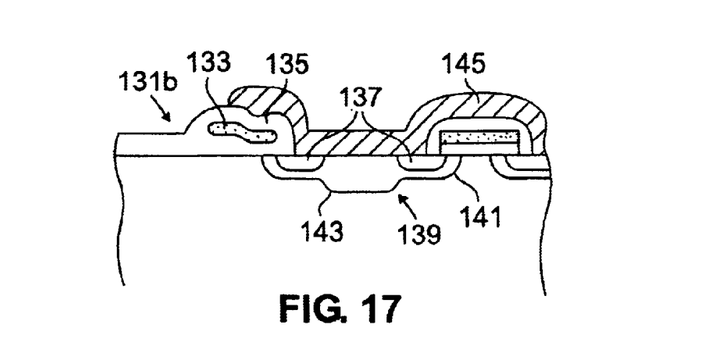
FIG. 17 is a schematic diagram illustrating a gate field with thicker oxide below the outer edge of the gate and no perimeter doping.
Figure 18:
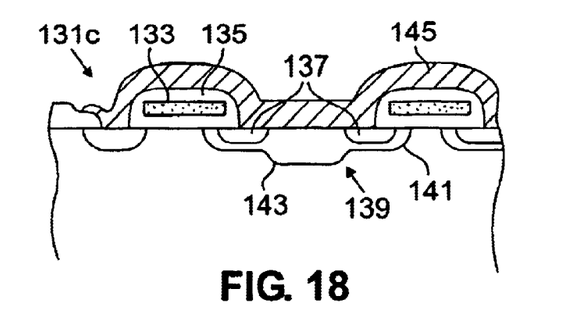
FIG. 18 is a schematic diagram illustrating a diffused junction termination with no active junction outside the gate poly.
Figure 19:
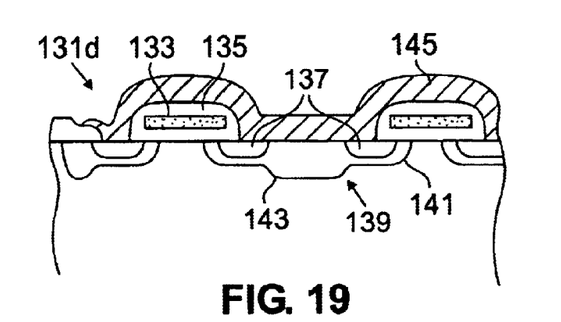
FIG. 19 is a schematic diagram illustrating a diffused junction termination with an inactive junction around part or all of the perimeter.
Figure 20:
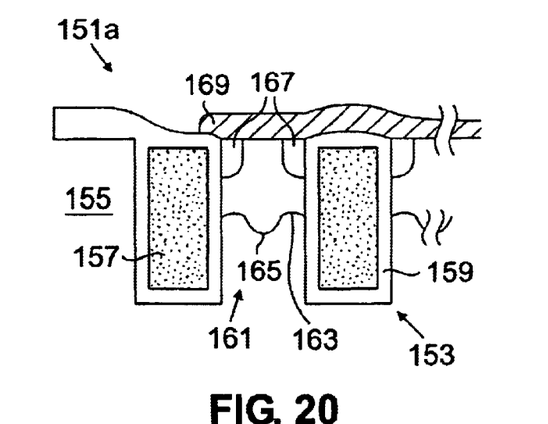
FIG. 20 is a schematic diagram illustrating a trench termination structure with the perimeter trench serving as the termination.
Figure 21:
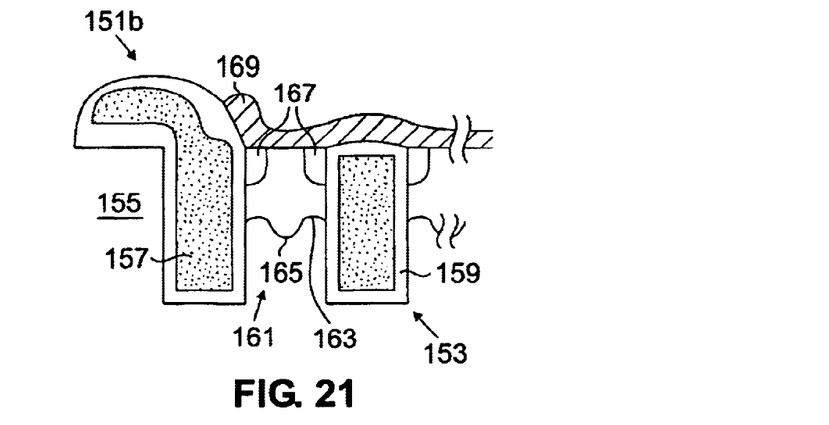
FIG. 21 is a schematic diagram illustrating a trench termination structure with the polysilicon from the perimeter trench serving as a field plate.
Figure 22:
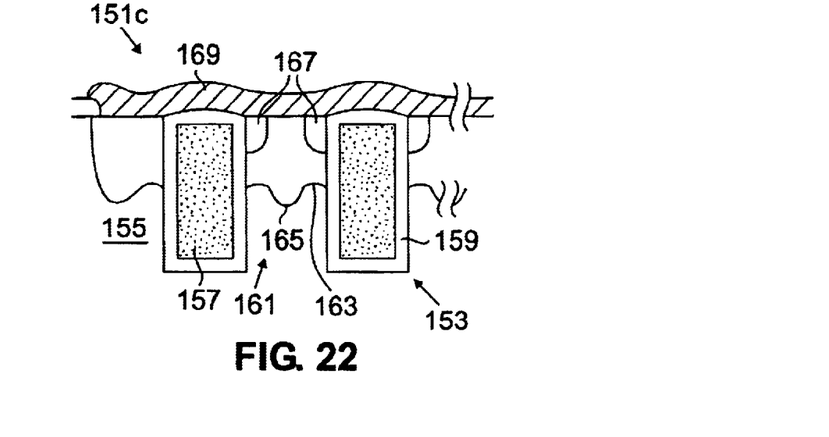
FIG. 22 is a schematic diagram illustrating a trench termination structure with a passive junction outside the perimeter trench sustaining the reverse voltage.
Figure 23:
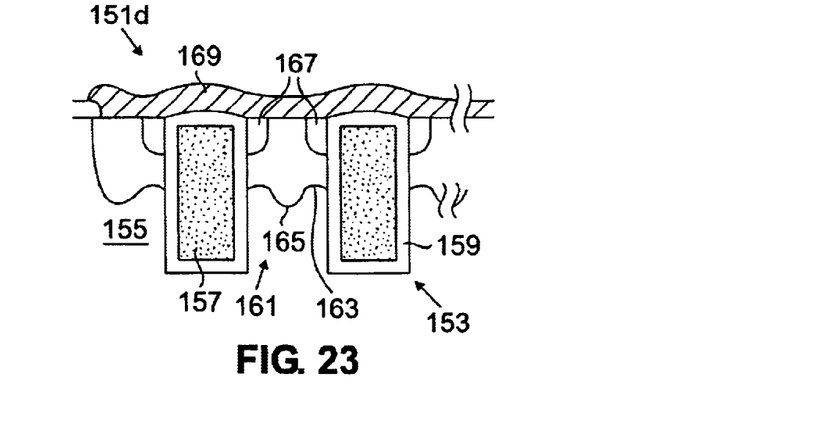
FIG. 23 is a schematic diagram illustrating a trench termination structure with an active junction outside the perimeter trench sustaining the reverse voltage.

Devices may be designed using any number of sub-arrays, each of which has one gate pad tile. In the examples shown in FIGS. 13–15, three representative die sizes that may be obtained are shown for a 5×7 sub-array, along with three possible sub-array arrangements 117a, 117b and 117c. Thus, FIG. 13 illustrates a device comprising a 3×3 arrangement of sub-arrays 117a. FIG. 14 depicts a 1×2 orientation 119 of sub-arrays, and FIG. 15 depicts a 2×3 orientation 121 of sub-arrays. TABLE 2 documents some of the other possible devices composed of the sub-array shown in FIG. 15.

TABLE 2

Arrangements of Sub-Arrays Each of Which Has a Dedicated Gate Pad and Consists of 6 × 8 Tiles

| Number of Sub-Arrays | Orientation of Sub-Arrays | Number of Tiles in the Horizontal Direction | Number of Tiles in the Vertical Direction | Ratio of Active to Total Tiles | Aspect Ratio |
|---|---|---|---|---|---|
| 1 | 1 × 1 | 6 | 8 | 34:48 | 3:4 |
| 2 | 1 × 2 | 6 | 16 | 73:96 | 3:8 |
| 2 | 2 × 1 | 12 | 8 | 75:96 | 3:2 |
| 3 | 1 × 3 | 6 | 24 | 112:144 | 1:4 |
| 3 | 3 × 1 | 18 | 8 | 116:144 | 9:4 |
| 4 | 1 × 4 | 6 | 32 | 151:192 | 3:16 |
| 4 | 2 × 2 | 12 | 16 | 161:192 | 3:4 |
| 4 | 4 × 1 | 24 | 8 | 157:192 | 3:1 |
| 5 | 1 × 5 | 6 | 40 | 190:240 | 3:20 |
| 5 | 5 × 1 | 30 | 8 | 198:240 | 15:4 |
| 6 | 1 × 6 | 6 | 48 | 229:288 | 1:6 |
| 6 | 2 × 3 | 12 | 24 | 247:288 | 1:2 |
| 6 | 3 × 2 | 18 | 16 | 249:288 | 9:8 |
| 6 | 6 × 1 | 36 | 8 | 239:288 | 9:2 |
| 7 | 1 × 7 | 6 | 56 | 268:336 | 3:28 |
| 7 | 7 × 1 | 42 | 8 | 280:336 | 21:4 |
| 8 | 1 × 8 | 6 | 64 | 307:384 | 3:32 |
| 8 | 2 × 4 | 12 | 32 | 333:384 | 3:8 |
| 8 | 4 × 2 | 24 | 16 | 337:384 | 3:2 |
| 8 | 8 × 1 | 48 | 8 | 321:384 | 6:1 |
| 9 | 1 × 9 | 6 | 72 | 346:432 | 1:12 |
| 9 | 3 × 3 | 18 | 24 | 382:432 | 3:4 |
| 9 | 9 × 1 | 54 | 8 | 362:432 | 27:4 |

The use of an array of tiles that can be configured late in the fabrication sequence to produce different size MOS-gated devices places some specific requirements on the tile design if the needed breakdown voltage is to be obtained. These requirements result in the following guidelines for tile layout:

1. The source and body region(s) of each tile should be separate from the source and body region(s) of all other tiles.

2. The gate(s) of each tile should be separate from the gate(s) of all other tiles.

3. A single metallized tile should be capable of sustaining the needed breakdown voltage when the tile and the termination are properly metallized.

4. Any number of tiles should be capable of sustaining the needed breakdown voltage when the tiles and the termination are properly metallized.

5. The combination of the source diffusion and the body diffusion, when electrically connected to the gate region in the tiles that form the scribe line and the outer perimeter of the edge termination, should be capable of sustaining the needed breakdown voltage.

These guidelines can be applied to each unique tile design to obtain the needed breakdown voltage. Devices manufactured using specific technologies are described below.

Planar MOS-gated devices fabricated using gate structures such as those shown in FIGS. 2–3 require termination structures. As discussed above, each tile geometry must follow five guidelines, while minimizing device on-resistance. Device on-resistance is minimized by obtaining the largest breakdown voltage using semiconductor materials with the lowest resistivity. Optimization of both the tile termination structure and the fabrication process are required.

The termination structures 131a–d shown in FIGS. 16–19 may be used with low voltage, planar MOS-gated devices. Each structure consists of a polysilicon gate 133 which is encapsulated in dielectric 135 and is disposed over source 137 and body 139 regions. In the particular devices shown, the body region consists of a shallower diffused region 141 and a deeper diffused region 143. A metallization layer 145 extends over the surface of the device providing contact to the diffused regions. The gate region adjacent to the perimeter may be electrically floating if the perimeter junction is not active, but must be electrically continuous with the gate if the perimeter junction is active.

The samples shown in FIGS. 16–19 are not an exhaustive list, but represent typical termination techniques that could be used. The use of a termination structure with an active junction increases the current that flows through a device with only a small increase in tile area. Such an active termination structure contributes to the current flow through the device, in addition to sustaining the breakdown voltage, while a passive termination structure only sustains the breakdown voltage.

The trench MOS-gated devices shown in FIGS. 11–12 also have a number of different tile layouts and fabrication processes that result in the required breakdown voltage. Examples of the resulting termination structures 151a–d are shown in FIGS. 20–23. As shown therein, each structure includes a series of trenches 153 that are formed in the epitaxial layer 155 of the device. Each trench is filled with doped polysilicon 157 and contains a layer of gate oxide 159. Each trench is bounded by a double diffused source and body region 161 that may consist, for example, of a shallower diffused p-type region 163 and a deeper diffused $P^+$ region 165. $N^+$ doped source regions 167 are disposed at the top of the trench and are also in electrical contact with a metallization layer 169. Variations of these termination structures, as well as other termination structures, may be used around each tile to optimize specific on-resistance. As with planar terminations, the gate region adjacent to the perimeter may be electrically floating if the perimeter junction is not active, but must be electrically continuous with the gate if the perimeter junction is active.

Although various embodiments are specifically illustrated and described herein, it will be appreciated that modifications and variations of the invention are covered by the above teachings and within the purview of the appended claims without departing from the spirit and intended scope of the invention. Furthermore, these examples should not be interpreted to limit the modifications and variations of the invention covered by the claims but are merely illustrative of possible variations.

What is claimed is:

1. A method for making a MOS-gated device, comprising the steps of:

providing a plurality of discrete tiles, each of said plurality of tiles having at least one source region, at least one body region, and a common drain region beneath the at least one source region; and     assembling the tiles into an array so as to form a MOS-gated device having a common source and body region and a common drain region,         wherein tiles forming an outer perimeter of the device are cut across a scribe line through the center of each outer perimeter tile such that each other perimeter tile comprises half a tile within the device.

2. The method of claim 1, wherein the plurality of tiles are essentially identical.

3. The method of claim 1, wherein each of the plurality of tiles is essentially rectangular.

4. The method of claim 1, wherein each of the plurality of tiles is essentially square.

5. The method of claim 1, wherein each tile has a plurality of gate contact regions disposed thereon.

6. The method of claim 5, wherein each tile is essentially rectangular, and wherein each corner of each tile has a gate contact region disposed thereon.

7. The method of claim 5, wherein each tile is essentially square, and wherein each corner of each tile has a gate contact region disposed thereon.

8. The method of claim 1, wherein each tile contains a plurality of source and body regions, and wherein the plurality of source and body regions are disposed in a sub-array.

9. The method of claim 1, wherein the array further comprises a gate metallization layer.

10. The method of claim 1, wherein the array further comprises a source and body metallization layer.

11. The method of claim 1, wherein the array further comprises a gate metallization layer and a source and body metallization layer, and wherein the gate metallization layer and the source and body metallization layer are electrically insulated from each other.

12. The method of claim 1, wherein at least some of said plurality of tiles comprise an epitaxial layer having at least one trench disposed therein, and wherein the at least one trench has a portion of doped polysilicon disposed therein.

13. The method of claim 1, wherein at least one of said plurality of tiles comprise a gate structure.

14. The method of claim 13, wherein a portion of the gate structure is electrically floating.

* * * * *